United States Patent [19]
Kamiguchi et al.

[11] Patent Number: 5,416,353
[45] Date of Patent: May 16, 1995

[54] NETORESISTANCE EFFECT ELEMENT

[75] Inventors: Yuzo Kamiguchi, Yokohama; Atsuhito Sawabe, Yokosuka; Masashi Sahashi; Hitoshi Iwasaki, both of Yokohama, all of Japan

[73] Assignee: Kabushiki Kaisha Toshiba, Kawasaki, Japan

[21] Appl. No.: 118,765

[22] Filed: Sep. 10, 1993

[30] Foreign Application Priority Data

Sep. 11, 1992 [JP] Japan .................. 4-242468

[51] Int. Cl.⁶ .............. H01L 27/22; H01L 29/82; H01L 43/00
[52] U.S. Cl. ................ 257/421; 257/427; 257/425; 257/536
[58] Field of Search .......... 257/421, 425, 427, 536, 257/9

[56] References Cited

U.S. PATENT DOCUMENTS

| | | | |
|---|---|---|---|
| 3,525,023 | 8/1970 | Pollock | 257/425 |
| 4,823,177 | 4/1989 | Prinz et al. | 257/421 |
| 4,978,938 | 12/1990 | Partin et al. | 257/421 |

OTHER PUBLICATIONS

IBM Tech. Disc. Bull., vol. 33, No. 11, Apr. 1991, pp. 469-472 "Imaging Magnetic Domains . . . ".
"Electronic analog of the electro-optic modulator", Supriyo Datta et. al., Appl. Phys. Lett., 56(7):665-667 (1990).
"Tunneling Between Ferromagnetic Films", M. Julliere, Physics Letters, 54A(3):225-226 (1975).
"Spin-Dependent Recombination in a Silicon p-n Junction", I. Solomon, Solid State Communications, 20(3):215-217 (1976).

*Primary Examiner*—Sara W. Crane
*Attorney, Agent, or Firm*—Finnegan, Henderson, Farabow, Garrett & Dunner

[57] ABSTRACT

A magnetoresistance effect element is prepared by successively forming one upon the other a first magnetic layer, a P- or N-type semiconductor layer, a second magnetic layer, and a magnetization fixing layer in this order on an insulating substrate. A Schottky junction is formed between the first magnetic layer and the semiconductor layer and between the semiconductor layer and the second magnetic layer. The relative angle between the magnetization direction within the first magnetic layer and the magnetization direction within the second magnetic layer is changed depending on the intensity of the magnetic field, leading to a change in the tunnel conductance.

19 Claims, 7 Drawing Sheets

NETORESISTANCE EFFECT ELEMENT

BACKGROUND OF THE INVENTION

1. Field of the Invention

The present invention relates to a magnetoresistance effect element suitable for use in, for example, a reproducing magnetic head and a high sensitivity magnetic sensor.

2. Description of the Related Art

With increase in a magnetic recording density, demands for improvement in the sensitivity of a magnetic head are on a sharp increase, and vigorous researches are being made in an attempt to develop a magnetic head utilizing a magnetoresistance effect.

The conventional magnetic head mainly utilizes a ferromagnetic magnetoresistance effect and includes, for example, an Fe—Ni permalloy thin film. However, the magnetoresistance ratio, i.e., $(p_1 - p_t)/p_0 \times 100$, where $p_1$ is the electric resistance in a direction parallel with the direction of magnetization, $p_t$ is the electric resistance in a direction perpendicular to the direction of magnetization, and $p_0$ is the electric resistance under a zero magnetic field, is only about 2% in the conventional magnetic head utilizing the magnetoresistance effect.

A magnetoresistance effect element comprising magnetic layers positioned to face each other with a nonmagnetic intermediate metal layer interposed therebetween is proposed in, for example, Japanese Patent Disclosure (Kokai) No. 2-61572. A magnetoresistance effect is obtained in this element by applying a magnetic field to the element so as to change the relative directions of the magnetic spins between the magnetic layers. The element basically utilizes the scattering of electrons, said scattering being dependent on the direction of spin generated at the interface between the magnetic layer and the intermediate layer, with the result that the thickness of the intermediate layer is made smaller than the mean free path of the electron.

However, the magnetoresistance effect element of the construction described above has a low resistivity, with the result that a high current density is required for obtaining a sufficient signal output. It follows that problems such as heat generation and electromigration are brought about, and reliability and durability of the element are insufficient.

A magnetoresistance effect element utilizing a magnetic tunneling junction is disclosed in, for example, Japanese Patent Disclosure No. 4-42417, Japanese Patent Disclosure (Kokai) No. 4-103013 and Japanese Patent Disclosure (Kokai) No. 4-103014. The element of this type comprises magnetic layers positioned to face each other with a very thin insulating film, i.e., about 10Å thick, interposed therebetween, and utilizes a change in tunnel conductance brought about by the relative angles of magnetizations of the magnetic layers.

The magnetoresistance effect element utilizing the magnetic tunneling junction has a small tunnel conductance, making it possible to obtain an output signal with a relatively low current density. Thus, problems such as heat generation and electromigration are unlikely to take place. However, it is necessary to form satisfactorily a very thin insulating film free from defects such as pin holes in manufacturing the element of this type. It is difficult to apply the element of this type to commercial manufacture, since the problems in terms of reproducibility, durability, stability, etc. are generated.

Also proposed is a magnetoresistance effect element having Fe/Ge/Co junction as a magnetic tunneling junction, as described in "Phys. Lett. 54A, 225 (1975)". In this element, however, the spin information of carriers of the magnetic layer within the semiconductor layer is lost when a tunneling current detects and reliability problem occurs if the intrinsic semiconductor layer of the Ge layer is formed thick. In other words, the element performs a desired function only when the Ge layer is formed very thin. It is also necessary to form an insulating layer acting as a barrier layer between the Ge layer and the magnetic Fe layer and between the Ge layer and the magnetic Co layer. What should be noted is that it is impossible to control the barrier height.

As described above, the magnetoresistance effect element utilizing a magnetic tunneling junction and the spin information of the carrier within the magnetic layer is highly useful in industries. However, various problems must be solved before the element is put to a practical use.

SUMMARY OF THE INVENTION

The present invention has been achieved in view of the situation described above. It is accordingly, an object of the present invention to provide a magnetoresistance effect element utilizing the spin information of the magnetic layer and having a novel construction adapted for the commercial manufacture.

According to a first embodiment of the present invention, there is provided a magnetoresistance effect element, comprising a first magnetic layer, a second magnetic layer, and a P- or N-type semiconductor layer interposed between said first and second magnetic layers, wherein junctions are formed between said first magnetic layer and said semiconductor layer and between said semiconductor layer and said second magnetic layer.

According to a second embodiment of the present invention, there is provided a magnetoresistance effect element, comprising a first magnetic layer, a second magnetic layer, and a semiconductor layer interposed between said first and second magnetic layers, said semiconductor layer including a first layer of a first conductivity type and a second layer of a second conductivity type, a junction being formed therebetween, and wherein junctions are formed between said first magnetic layer and said first layer and between said second magnetic layer and said second layer.

Further, according to a third embodiment of the present invention, there is provided a magnetoresistance effect element, comprising a first magnetic layer, a first semiconductor layer of a first conductivity type formed on said first magnetic layer, a second semiconductor layer of a second conductivity type formed on said first semiconductor layer, a second magnetic layer formed on said second semiconductor layer, and a third semiconductor layer of said second conductivity type formed on said first semiconductor layer, wherein junction are formed between the first magnetic layer and the first semiconductor layer, between the first semiconductor layer and the second semiconductor layer, between the second semiconductor layer and the second magnetic layer, and between the first semiconductor layer and the third semiconductor layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A magnetoresistance effect element according to a first embodiment of the present invention comprises a first magnetic layer, a second magnetic layer, and a P- or N-type semiconductor layer interposed between the first and second magnetic layers. Junctions are formed between the first magnetic layer and the semiconductor layer and between the semiconductor layer and the second magnetic layer.

The present inventors have paid attentions to the fact that the carrier injected into a semiconductor layer doped with an N- or P-type impurity tends to be diffused easily while maintaining the spin polarization information, compared with the carrier injected into an i-type semiconductor layer, arriving at the first embodiment of the present invention.

In the structure having a semiconductor layer sandwiched between two magnetic layers, the carriers injected from the first magnetic layer into the semiconductor layer are diffused within the semiconductor layer while maintaining the spin polarization information so as to migrate through an injection barrier of the carriers such as a Schottky barrier to reach the second magnetic layer. Accordingly, if the direction of magnetization of one of the magnetic layer is fixed and the direction of magnetization of the other magnetic layer is changed by the external magnetic field, the magnetude of a tunnel current formed by the carrier injection corresponds to the magnetic field intensity since the tunneling probability is changed depending on the direction of magnetization in the first and second magnetic layers.

A semiconductor layer doped with a P- or N-type impurity permits transmitting the spin polarization information efficiently, compared with an i-type semiconductor layer. Thus, the thickness of the semiconductor layer can be increased by using a P- or N-type semiconductor. Also, a Schottky barrier can be formed satisfactorily between the semiconductor layer and the second magnetic layer in the element of the present invention. The Schottky barrier thus formed can be utilized as a ferromagnetic tunnel barrier. It follows that the doped semiconductor layer used in the embodiment permits producing a magnetic tunnel effect even if the semiconductor layer has a thickness of 100Å or more, though it was necessary in the conventional element to use a tunnel film as thin as about several ten angstrom. Since the thickness can be increased, a tunnel film free from defects such as pin holes can be formed easily, making it possible to increase the reproducibility, stability, etc. of the magnetoresistance effect element.

Also, the spin polarization information can be efficiently transmitted in the case of using a doped semiconductor layer, as described previously. Thus, the sensitivity can be improved even if the thickness of the doped semiconductor layer is made substantially equal to that of the i-type semiconductor layer used in the conventional element.

The impurity doping amount in the semiconductor layer, which can be determined appropriately in view of the material of the magnetic layer, is preferably about $10^{16}$ cm$^{-3}$ to $10^{20}$ cm$^{-3}$. On the other hand, the thickness of the semiconductor layer, which can be determined appropriately, is preferably 50 to 10,000Å, more preferably 200 to 10,000Å. The thickness of the magnetic layers, which can be determined appropriately, is preferably 10 to 10000Å.

A ferromagnetic metal such as Fe, Ni, Co or an alloy thereof can be used for forming the magnetic layer. It is also possible to use a half metal such as PtMnSb, NiMnSb or CoMnSb, a ferrite such as $Fe_3O_4$, $CoFe_2O_4$ or $MnFe_2O_4$, or a compound exhibiting magnetism such as $CrO_2$ or $KCrSe_2$.

The semiconductor layer can be formed of an elemental semiconductor such as Si or Ge, or a compound semiconductor such as SiGe, GaAs or ZnSe. Of course, the semiconductor layer should be doped with a suitable impurity. It is necessary to select the material of the semiconductor layer appropriately in view of the material of the magnetic layer.

Figure 1:
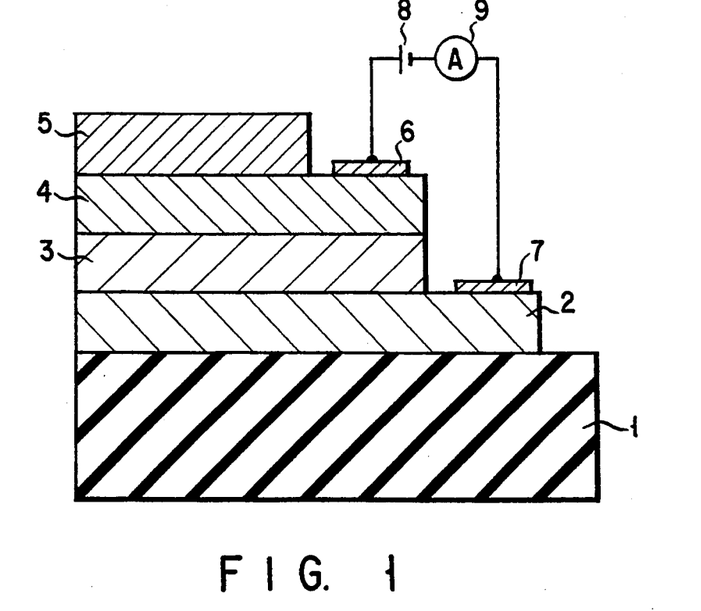
FIG. 1 is a cross sectional view showing a magnetoresistance effect element according to a first embodiment of the present invention.

FIG. 1 shows the construction of a magnetoresistance effect element according to the first embodiment of the present invention. As shown in the drawing, the magnetoresistance effect element comprises an insulating substrate 1, a magnetic layer 2 formed on the substrate 1, a semiconductor layer 3 formed on the magnetic layer 2, and a magnetic layer 4 formed on the semiconductor layer 3.

A Schottky junction is formed between the magnetic layer 2 and the semiconductor layer 3. Another Schottky junction is formed between the magnetic layer 4 and the semiconductor layer 3.

A magnetization fixing layer 5 of an anti-ferromagnetic material such as FeMn alloy is formed on the surface of the second magnetic layer 4. The magnetization fixing layer 5 serves to impart a magnetic anisotropy in one in-plane direction of the magnetic layer 4.

Electrodes layers 6 and 7 each consisting of, for example, Au are formed on the surfaces of the magnetic layers 2 and 4, respectively. These electrode layers 6 and 7 are connected to a power supply 8 with an ammeter 9 interposed between the power supply 8 and the electrode layer 7. It is desirable to form these electrode layers 6 and 7 in the case where the magnetic layers 2 and 4 are formed of a material having a high electric resistance such as a ferrite series material. However, it is not absolutely necessary to form these electrode layers 6 and 7 where these magnetic layers are formed of a good conductor such as Fe or a CoFe alloy. In order to prevent a barrier formation in injecting carriers such as electrons into the magnetic layer, it is necessary to select the material of the electrode layer such that an ohmic contact is achieved between the electrode layer and the magnetic layer.

An example of the magnetoresistance effect element comprises the insulating substrate 1 of a GaAs single crystal, the magnetic layer 2 of a thin Fe film having a thickness of about 100Å, the semiconductor layer 3 of an N-type GaAs layer doped with Se and having a thickness of about 500Å, the magnetic layer 4 of a CoFe alloy layer having a thickness of about 100Å, and the magnetization fixing layer 5 of a FeMn alloy layer having a thickness of about 150Å.

The magnetic field applying to the element of the construction described above so as not to rotate the magnetization of the magnetic layer 4 in which the direction of magnetization is fixed by the magnetization fixing layer 5, the magnetic spins within the magnetic layer 2 alone are rotated in the presence of the magnetic field. It follows that the relative angle between the direction of magnetization in the magnetic layer 2 and the direction of magnetization in the magnetic layer 4 is changed depending on the intensity of the magnetic field applied to the element. The change in the relative angle noted above is reflected in the change in the tunnel conductance. It follows that, by applying a constant voltage between the magnetic layers 2 and 4 from the power supply 8, the value of current detected by the ammeter 9 is changed to conform with the value of the tunnel conductance.

Figure 3:
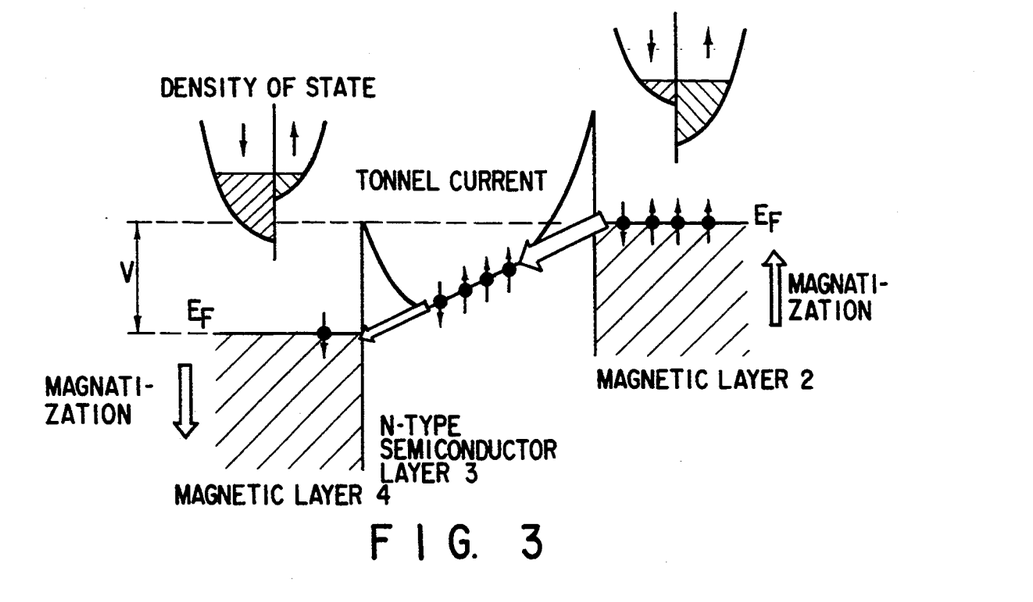
FIGS. 3, 4A and 4B collectively show the operating principle of the magnetoresistance effect element according to the first embodiment of the present invention.
Figure 4A:
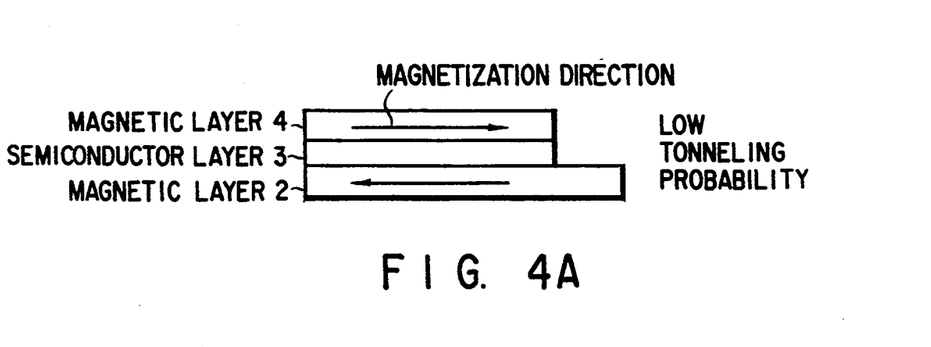
Figure 4B:
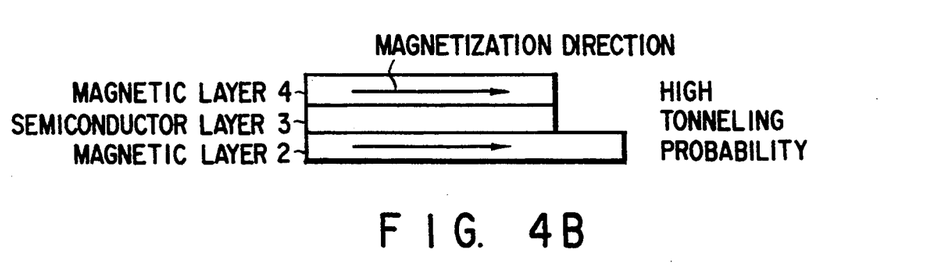

The change in the tunnel conductance noted above relates to the directions of the magnetization in the magnetic layers 2 and 4. As described previously, the direction of magnetization in the magnetic layer 4 is fixed. On the other hand, the direction of magnetization in the first magnetic layer 2 depends on the direction of the magnetic field applied to the element. The tunnel conductance in the case where a magnetic filed is applied in an anti-parallel direction (i.e., in parallel with and in the direction opposite to the magnetization direction in the second magnetic layer) is lower than that in the case where a magnetic field is applied in a parallel direction (i.e., in parallel with and in the direction same as the magnetization direction in the second magnetic layer). FIGS. 3 to 4B collectively show the principle of the change in the tunnel conductance.

Specifically, where the two magnetic layers are magnetized in the anti-parallel direction as shown in FIG. 4A, the density of state of the up-spinned electrons in one of these magnetic layers is rendered high, with the density of state of the down-spinned electrons being rendered high in the other magnetic layer, as shown in FIG. 3. It follows that the tunneling probability is lowered. On the other hand, where the two magnetic layers are magnetized in the parallel direction as shown in FIG. 4B, the density of state of up-spinned electrons is rendered high in each of the two magnetic layers, leading to a high tunneling probability.

As described previously, the tunnel conductance in the case of applying a magnetic field in the parallel direction is higher than that in the case of applying a magnetic field in the anti-parallel direction. It follows that, if a constant voltage is applied between the first and second magnetic layers 2 and 4 as shown in FIG. 1, the current value in the case of applying a magnetic filed in the parallel direction is rendered higher than that in the case of applying a magnetic field in the anti-parallel direction.

If the magnetoresistance effect element shown in FIG. 1 is driven under a constant current, the change in the tunnel conductance can be detected as a change in voltage.

The semiconductor layer 3 in the element shown in FIG. 1 is of N-type. However, it is also possible to use a P-type semiconductor layer as the semiconductor layer 3. Also, holes injection into the magnetic layer may be employed in place of the electrons injection in the element shown in FIG. 1.

Figure 2:
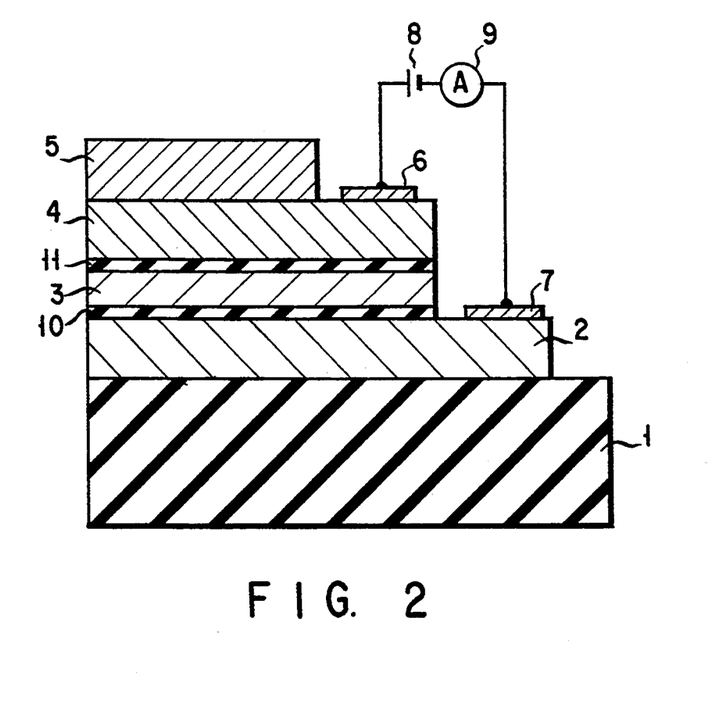
FIG. 2 is a cross sectional view showing a modification of the magnetoresistance effect element shown in FIG. 1.

In the element shown in FIG. 1, a Schottky barrier is formed between the semiconductor layer 3 and the magnetic layer 4 and between the layer 3 and the magnetic layer 2 so as to provide a barrier of carrier injection from the magnetic layer into the semiconductor layer 3. Alternatively, an insulating layer formed by, for example, oxidizing each of the surface regions of a semiconductor layer as shown in FIG. 2 may be used in place of the Schottky barrier. Specifically, FIG. 2 shows that insulating layers 10 and 11 are interposed between the semiconductor layer 3 and the magnetic layer 2 and between the layer 3 and the magnetic layer 4, respectively.

If the tunnel barrier, i.e., carrier injection barrier, is formed of an insulating layer alone, the insulating layer must be formed very thin. In the case of forming a very thin insulating layer, it is very important to prevent the insulating layer from bearing defects such as pin hole occurrence, as described previously in conjunction with the prior art. Where an insulating layer is employed in combination with a doped semiconductor layer as shown in FIG. 2, however, the two magnetic layers are prevented from directly contacting each other even if pin holes are formed in the insulating layer. It follows that it is possible to decrease the thickness of the insulating layer. What should also be noted is that the carriers migrate within the doped semiconductor layer while maintaining the spin information, with the result that the element constructed as shown in FIG. 2 permits producing an effect similar to that produced by the element constructed as shown in FIG. 1.

In the element shown in FIG. 2, a good Schottky barrier need not be formed between the magnetic layer and the semiconductor layer, leading to an increased degree of freedom in selecting the materials of the element.

The insulating layer 10 or 11 included in the element shown in FIG. 2 can be formed by oxidizing the surface region of the semiconductor layer or the magnetic layer included in the element. Alternatively, it is possible to use as the insulating layer an oxide film of $SiO_2$ or $Al_2O_3$, a nitride film of $Si_3N_4$ or AlN, etc.

The magnetoresistance effect element according to the second embodiment of the present invention comprises a first magnetic layer, a second magnetic layer, and a semiconductor layer interposed between said first and second magnetic layers, the semiconductor layer including a first layer of a first conductivity type and a second layer of a second conductivity type, a junction being formed therebetween, and wherein junction are formed between the first magnetic layer and the first layer and between the second magnetic layer and the second layer.

The particular construction of the second embodiment permits forming a magnetoresistance effect element utilizing the spin-dependent recombination effect within the semiconductor layer. Specifically, in the element of the second embodiment, a semiconductor layer consisting of P- and N-type layers forming a PN junction therebetween is interposed between two magnetic layers and junctions are formed between one of the magnetic layers and the P-type layer and between the other magnetic layer and the N-type layer. In this structure, spin-polarized holes injected from one of the magnetic layers are recombined with spin-polarized electrons injected from the other magnetic layer in the vicinity of the PN junction formed within the semiconductor layer. What should be noted is that the probability of recombination is changed depending on the relative angle of spins between the two magnetic layers, leading to a change in the time required for the carrier extinction. As a result, a change in the carrier density is brought about, leading to a change in the electric resistance. Accordingly, as in the first embodiment, if the direction of magnetization of one of the magnetic layers is fixed and the direction of magnetization of the other magnetic layer is changed by the external magnetic field, the electric resistance is changed depending on the state of the magnetic field.

In the element of the second embodiment, the amount of each of the impurities doped in the P- and N-type semiconductor layers, which can be determined appropriately in view of the material of the magnetic layer, should desirably be about $10^{16}$ cm$^{-3}$ to $10^{20}$ cm$^{-3}$. The thickness of the semiconductor layer including the P- and N-type layers, which can also be determined appropriately, is preferably 50 to 10,000Å, more preferably 200 to 10,000Å. The thickness of the magnetic layers, which can be determined appropriately, is preferably 10 to 10,000Å.

Further, the materials of the magnetic layer and the semiconductor layer are substantially equal to those in the element of the first embodiment.

Figure 5:
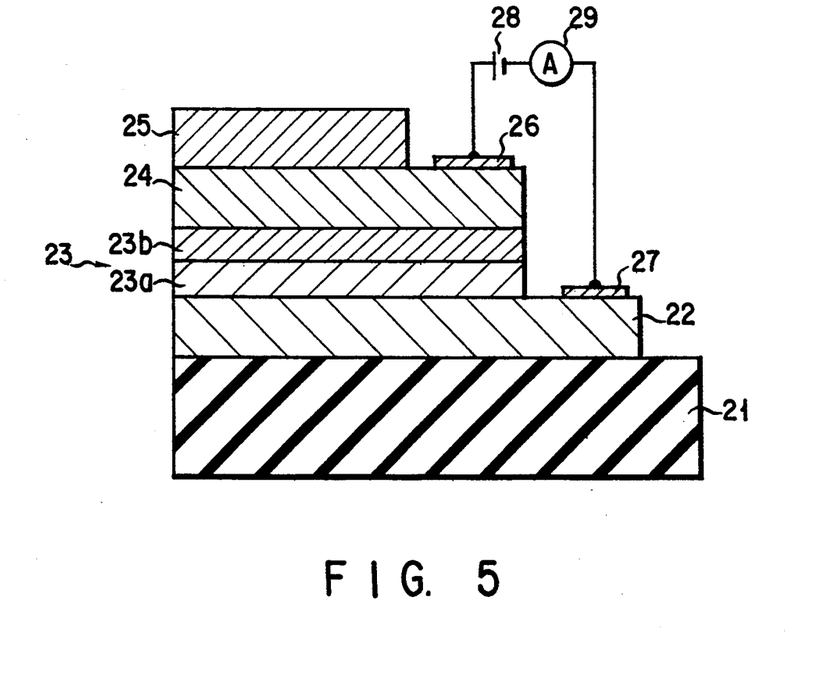
FIG. 5 is a cross sectional view showing a magnetoresistance effect element according to a second embodiment of the present invention.

FIG. 5 shows the construction of a magnetoresistance effect element according to the second embodiment of the present invention. As shown in the drawing, the element comprises a magnetic layer 22 formed on an insulating substrate 21, a semiconductor layer 23 formed on the first magnetic layer 22, and a magnetic layer 24 formed on the semiconductor layer 23. The semiconductor layer 23 is of a double layer structure of a first layer 23a of a first conductivity type and a second layer 23b of a second conductivity type, and a junction is formed therebetween.

Junctions are formed between the first magnetic layer 22 and the first layer 23a of the semiconductor layer 23 and between the second magnetic layer 24 and the second layer 23b of the semiconductor layer 23. The junctions are not restricted specific one. An ohmic junction and a Schottky junction can be used. The conductivity types of these first and second layers 23a, 23b of the semiconductor layer 23 need not be restricted, as far as these conductivity types are opposite to each other. For example, the first and second layers 23a and 23b are N- and P-type, respectively.

A magnetization fixing layer 25 consisting of an antiferromagnetic material such as an FeMn alloy is formed on the surface of the magnetic layer 24 in order to impart a magnetic anisotropy in one direction within a plane of the magnetic layer 24, as in the first embodiment of the present invention. Further, electrode layers 26 and 27 each consisting of, for example, Au are formed on the surfaces of the magnetic layers 22 and 24, respectively. Still further, a power supply 28 is connected between these electrode layers 26 and 27, with an ammeter 29 interposed between the power supply 28 and the first magnetic layer 22. As in the first embodiment described previously, it is desirable to mount these electrode layers 26, 27 in the case where the magnetic layers 22, 24 are formed of a material having a high electric resistance such as a ferrite series material. However, it is not absolutely necessary to mount these electrode layers in the case where these magnetic layer are formed of a good conductor such as Fe or a CoFe alloy.

The magnetic field applying to the element of the construction described above so as not to rotate the magnetization of the magnetic layer 24 in which the direction of magnetization is fixed by the magnetization fixing layer 25, the magnetic spins within the magnetic layer 22 alone are rotated in the presence of the magnetic field. It follows that the relative angle between the direction of magnetization in the magnetic layer 22 and the direction of magnetization in the magnetic layer 24 is changed depending on the intensity of the magnetic field applied to the element. The change in the relative angle noted above is reflected in the change in the probability of recombination of the electrons and holes injected from the magnetic layers 22, 24 into the first and second layers 23a, 23b of the semiconductor layer 23, respectively. It follows that, by applying a constant voltage between the magnetic layers 22 and 24 from the power supply 28, the value of current detected by the ammeter 29 is changed to conform with the value of the probability of recombination of the electrons and holes.

Figure 6:
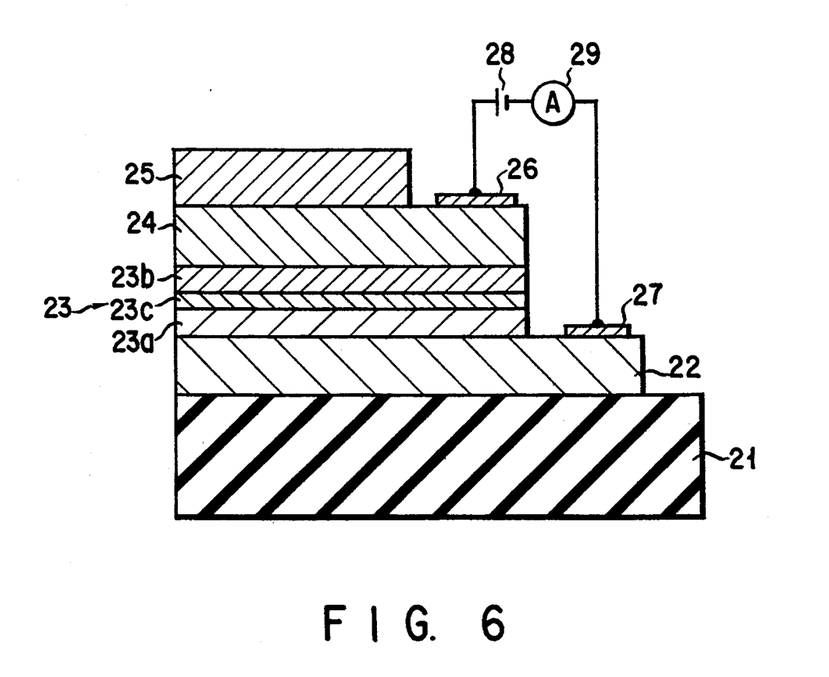
FIG. 6 is a cross sectional view showing a modification of the magnetoresistance effect element shown in FIG. 5.

FIG. 6 shows a modification of the element shown in FIG. 5. In this modification, a third layer 23c consisting of an i-type semiconductor or a semiconductor of a high resistivity, e.g., a P$^-$- or N$^-$-type semiconductor, is interposed between the first and second layers 23a and 23b of the semiconductor layer 23. In this case, electrons and holes are recombined within the third layer 23c. Also, the carriers which are not recombined dominate the value of current. Because of the recombination enhancement effect, the element shown in FIG. 6 permits obtaining a change in the current value greater than that obtained in the element shown in FIG. 5.

Figure 7:
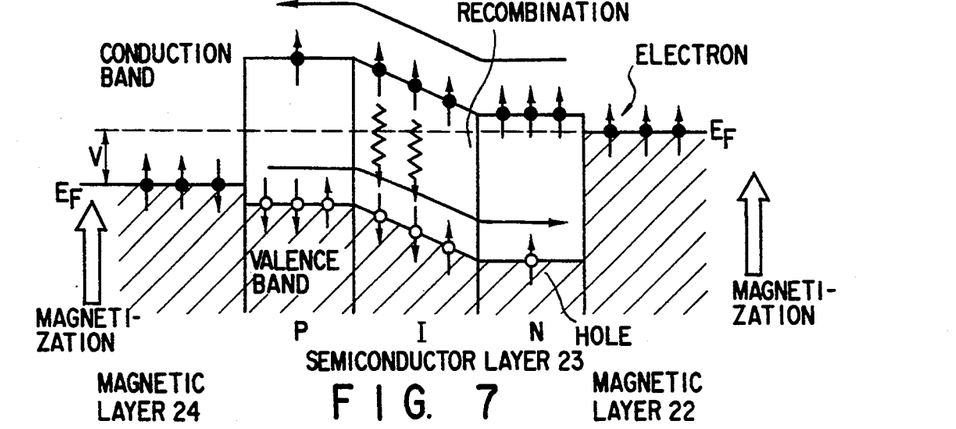
FIGS. 7, 8A and 8B collectively show the operating principle of the magnetoresistance effect element according to the second embodiment of the present invention.
Figure 8A:
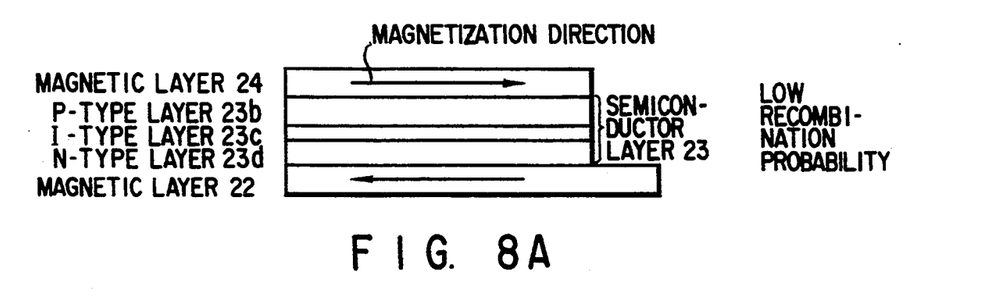
Figure 8B:
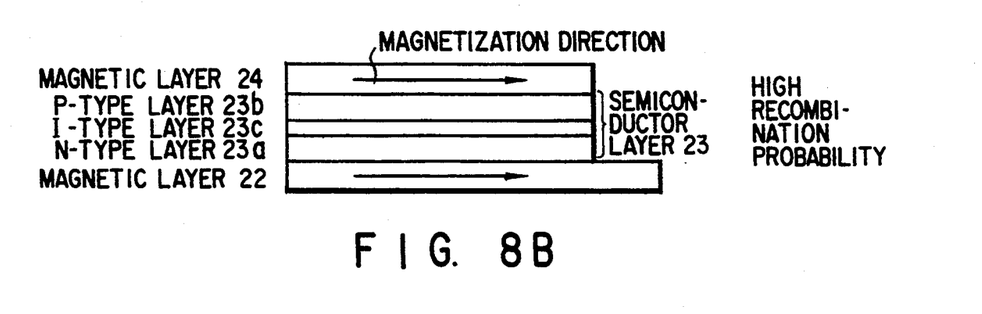

FIGS. 7 to 8B collectively show the operating principle of the element according to the second embodiment of the present invention. These drawings cover the case where the semiconductor layer 23 is of a PIN structure as shown in FIG. 6.

Where a magnetic field is applied to the element in a parallel direction with respect to the direction of magnetization in the magnetic layer 24, in which the magnetization is fixed by the magnetization fixing layer 25, the electric resistance is rendered higher than in the case where a magnetic field is applied to the element in an anti-parallel direction. Specifically, in the case of applying a parallel magnetic field, the direction of magnetization in the magnetic layer 22 is rendered parallel with the direction of magnetization in the magnetic layer 24, as shown in FIG. 8B. In this case, the spinning directions of the electrons and holes injected from the magnetic layers 22 and 24 into the first and second layers 23a and 23b, respectively, of the semiconductor layer 23 are rendered anti-parallel with a high probability. As a result, the electrons and holes migrated into the third layer 23c, i.e., the I-type semiconductor layer, are recombined within the third layer 23c with a high probability. On the other hand, where the magnetic layer 22 is magnetized in the anti-parallel direction as shown in FIG. 8A, the probability of recombination is rendered low. It should be noted that the amount of carriers contained in the I-type third layer 23c is affected by the probability of recombination. Specifically, in the case of a low recombination probability, i.e., where a magnetic field is applied in the anti-parallel direction, the carrier density within the I-type semiconductor layer 23c is increased so as to decrease the electric resistance. Likewise, the electric resistance is increased in the case of a parallel magnetic field application which brings about a high recombination probability. It follows that, if a constant voltage is applied as shown in FIGS. 5 and 6, the current value during a parallel magnetic field application, which brings about an increased electric resistance, is made smaller than that during an anti-parallel magnetic field application.

It is possible to obtain a large change in electric resistance by utilizing the carrier accumulation effect produced by the third layer 23c formed of an I-type semiconductor. However, a magnetoresistance effect can be similarly obtained even if the third layer 23c is omitted such that a PN junction is formed between the first and second layers 23a and 23b. It is also possible to use a semiconductor layer of a high resistivity such as a P$^-$- or N$^-$-type layer in place of the I-type layer 23c, with substantially the same effect.

Figure 9:
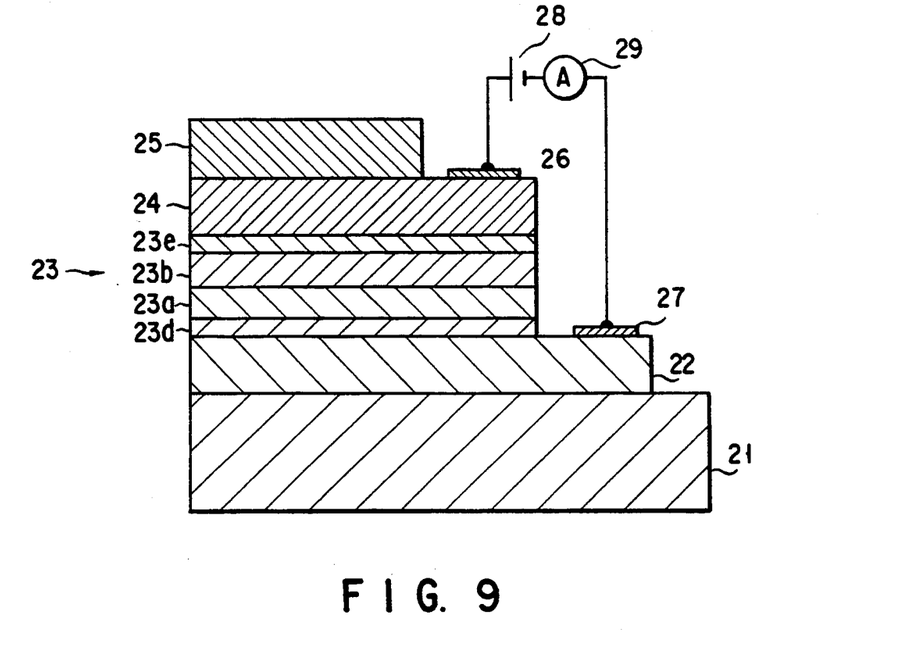
FIG. 9 is a cross sectional view showing another modification of the magnetoresistance effect element shown in FIG. 5.

FIG. 9 shows another modification of the element shown in FIG. 5. In this modification, additional semiconductor layer 23d and 23e are interposed between the magnetic layer 22 and the first layer 23a of the semiconductor layer 23 and between the second layer 23b of the semiconductor layer 23 and the magnetic layer 24, respectively. These additional semiconductor layers 23d and 23e are intended to improve the junctions between the magnetic layer and the adjacent semiconductor layer.

A magnetoresistance effect element according to the third embodiment of the present invention comprises a first magnetic layer, a first semiconductor layer of a first conductivity type formed on the first magnetic layer, a second semiconductor layer of a second conductivity type formed on the first semiconductor layer, a second magnetic layer formed on the second semiconductor layer, and a third semiconductor layer of the second conductivity type formed on the first semiconductor layer, wherein junctions are formed between the first magnetic layer and the first semiconductor layer, between the first semiconductor layer and the second semiconductor layer, between the second semiconductor layer and the second magnetic, and between the first semiconductor layer and the third semiconductor layer.

The magnetoresistance effect element according to the third embodiment also utilizes in principle the spin-dependent recombination effect within the semiconductor layer, as in the second embodiment described previously. However, the element in the third embodiment is of a three-terminal structure like a transistor in contrast to a two-terminal structure in the second embodiment.

In the element of the third embodiment, the amount of the impurity doped in each of the semiconductor layers, which can be determined appropriately in view of the material of the magnetic layer, should desirably be about $10^{16}$ cm$^{-3}$ to $10^{20}$ cm$^{-3}$. The total thickness of the first and second semiconductor layers, which can also be determined appropriately, is preferably 50 to 10,000Å, more preferably 200 to 10,000Å. On the other hand, the thickness of the third semiconductor layer, which functions as the collector of a transistor as described later, is not particularly restricted in the present invention. The thickness of the magnetic layers, which can be determined appropriately, is preferably 10 to 1,000Å.

Further, the materials of the magnetic layer and the semiconductor layer are substantially equal to those in the element of the first embodiment.

Figure 10:
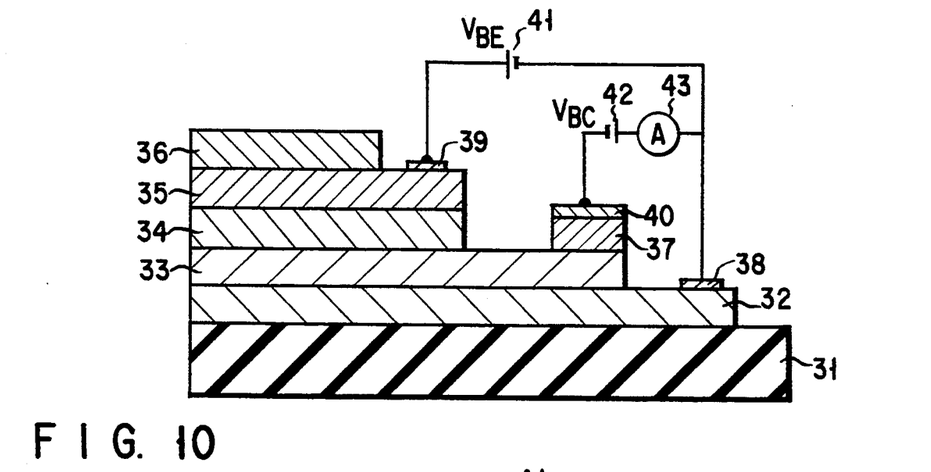
FIG. 10 is a cross sectional view showing a magnetoresistance effect element according to a third embodiment of the present invention.

FIG. 10 shows the construction of a magnetoresistance effect element according to the third embodiment of the present invention. As shown in the drawing, the element comprises a magnetic layer 32 formed on an insulating substrate 31, a semiconductor layer 33 of a first conductivity type formed on the magnetic layer 32, a semiconductor layer 34 of a second conductivity formed on a predetermined region of the semiconductor layer 33, and a magnetic layer 35 formed on the semiconductor layer 34. Further, a semiconductor layer 37 of the second conductivity type is formed on the semiconductor layer 33 such that the semiconductor layers 34 and 37 are positioned close to each other.

In the structure shown in FIG. 10, junctions are formed between the magnetic layer 32 and the semiconductor layer 33 and between the magnetic layer 35 and the second semiconductor layer 34. The junctions are not restricted specific one. An ohmic junction and a Schottky junction can be used. The conductivity types of the semiconductor layers 33 and 34 need not be restricted as far as these conductivity types are opposite to each other. For example, the semiconductor layers 33 and 34 can be of N- and P-type, respectively. In this case, the semiconductor layer 37 should be of P-type.

A magnetization fixing layer 36 made of an anti-ferromagnetic material such as an FeMn alloy is formed on the surface of the magnetic layer 35 in order to impart a magnetic anisotropy in one direction within a plane of the magnetic layer 35.

Electrode layers 38 and 39 each consisting of, for example, gold are formed on the surfaces of the magnetic layers 32 and 35, respectively, and connected to each other with a power supply 41 interposed therebetween. Also, an electrode layer 40 made of, for example, gold is formed on the surface of the semiconductor layer 37, and connected to the line between the power supply 41 and the electrode layer 38 with a series circuit consisting of a power supply 42 and an ammeter 43 connected therebetween.

Where the magnetic layers 32 and 35 are formed of a material having a high electric resistance such as a ferrite series material, it is desirable to mount the electrode layers 38 and 39, as in the first embodiment of the present invention described previously. However, it is not absolutely necessary to mount these electrode layers 38, 39 in the case of using a good conductor such as Fe or a CoFe alloy for forming these magnetic layers 32 and 35.

In the structure shown in FIG. 10, the semiconductor layers 33, 34 and 37 are called a base B, an emitter E and a collector C, respectively, and the first and second magnetic layers 32 and 35 act as a base electrode and an emitter electrode, respectively.

If an external magnetic field is changed with a bias current allowed to flow between the base B and the emitter E, the current flowing between the base B and the collector C is changed depending on the external magnetic field.

Figures 13, 14A:
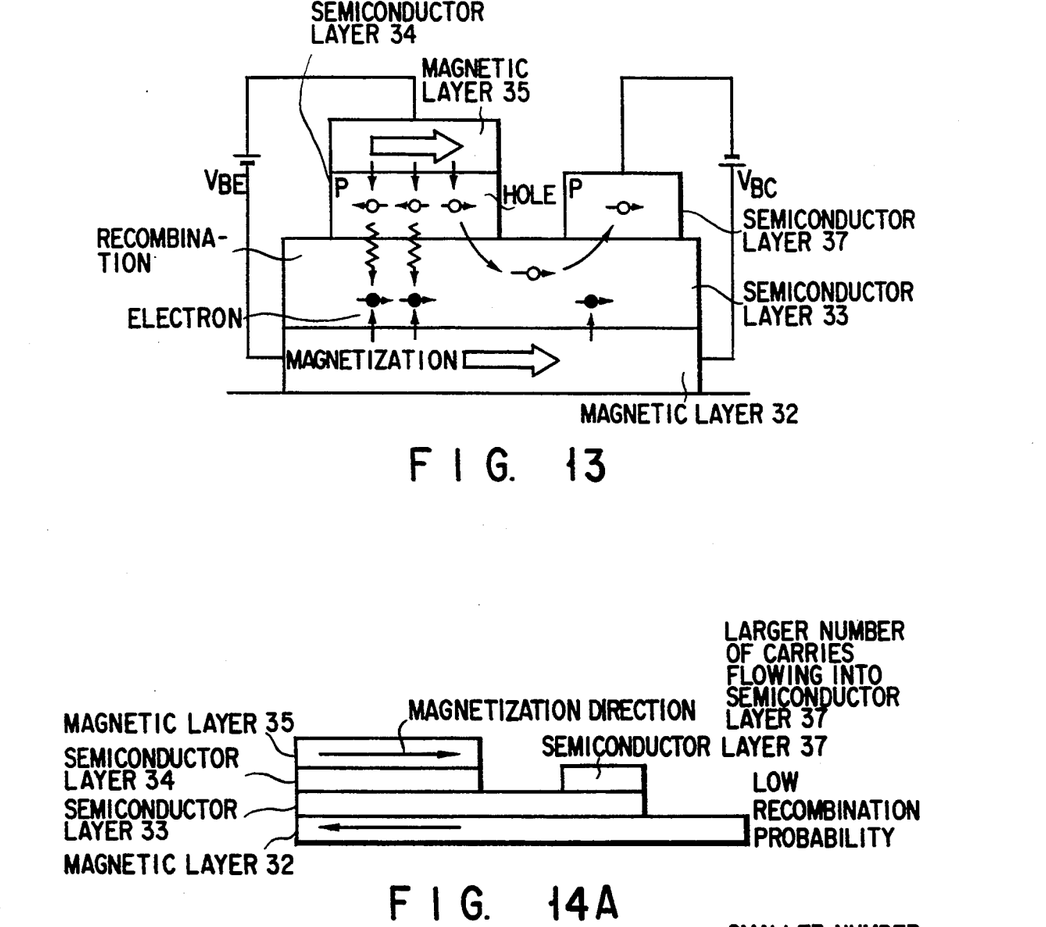
FIGS. 13, 14A and 14B collectively show the operating principle of the magnetoresistance effect element according to the third embodiment of the present invention.
Figure 14B:
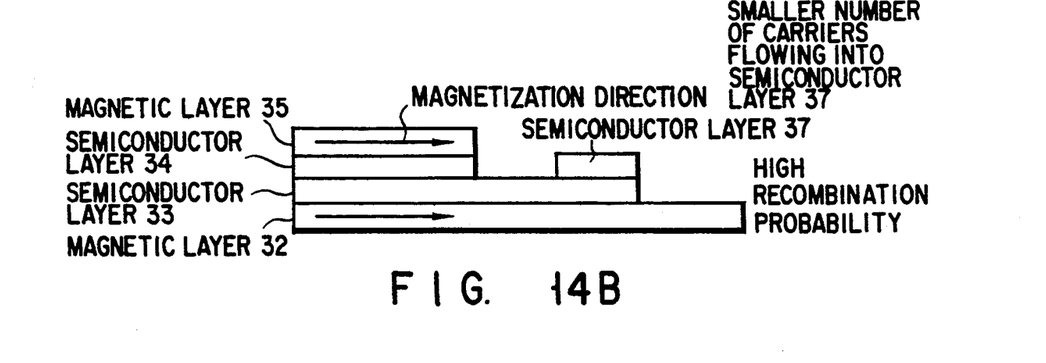

FIGS. 13 to 14B collectively show the principle of the change in the current between the base B and the collector C, which is caused by the external magnetic field.

As shown in FIG. 13, the magnetization within the magnetic layer 35 is fixed by the magnetization fixing layer, with the result that the magnetization direction within the magnetic layer 32 alone is changed by the direction of the external magnetic field. Where the direction of the external magnetic field is parallel with the magnetization direction within the magnetic layer 35, the magnetization directions within the magnetic layers 32 and 35 are rendered parallel with each other, as shown in FIG. 14B. In this case, the spinning direction of the electrons injected from the magnetic layer 32 into the semiconductor layer 33 is made opposite to the spinning direction of the holes injected from the magnetic layer 35 into the semiconductor layer 33 through the semiconductor layer 34 with a high ratio. On the other hand, where the direction of the external magnetic field is anti-parallel with the magnetization direction within the magnetic layer 35, the magnetization directions within the magnetic layers 32 and 35 are rendered anti-parallel, as shown in FIG. 14A. In this case, the holes and the electrons are spun in the same direction with a high ratio. It follows that the recombination probability under a parallel magnetic field is rendered higher than that under an anti-parallel magnetic field, resulting in a diminished amount of the remaining carriers.

The carriers (holes in this case) which are not recombined and remain within the semiconductor layer 33 are supplied into the semiconductor layer 37. The current flowing between the semiconductor layer 37 and the magnetic layer 32, i.e., the B-C current, is controlled by the carriers supplied into the semiconductor layer 37 noted above. It follows that the B-C current is increased during application of the anti-parallel magnetic field.

The element constructed as shown in FIG. 10 according to the third embodiment of the present invention is substantially equal to the element according to the second embodiment in the principle of producing the magnetoresistance effect. However, the element of the third embodiment permits more effectively separating the bias current from the signal current and performs a signal amplifying function, leading to a high output.

Figure 11:
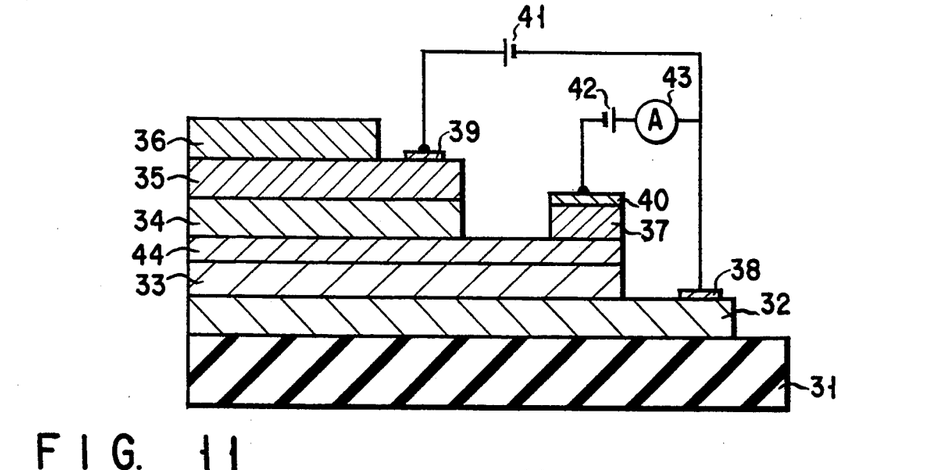
FIG. 11 is a cross sectional view showing a modification of the magnetoresistance effect element shown in FIG. 10.

FIG. 11 shows a modification of the element shown in FIG. 10. In the modification of FIG. 11, an I-type semiconductor layer 44 is interposed between the semiconductor layers 33 and 34 and between the semiconductor layers 33 and 37. It is possible to use a semiconductor layer doped with a low concentration of an impurity in place of the I-type semiconductor layer 44. The I-type semiconductor layer 44 has the recombination enhancement effect as in the element constructed as shown in FIG. 6 of second embodiment. Electrons and holes are recombined within the layer 44.

Figure 12:
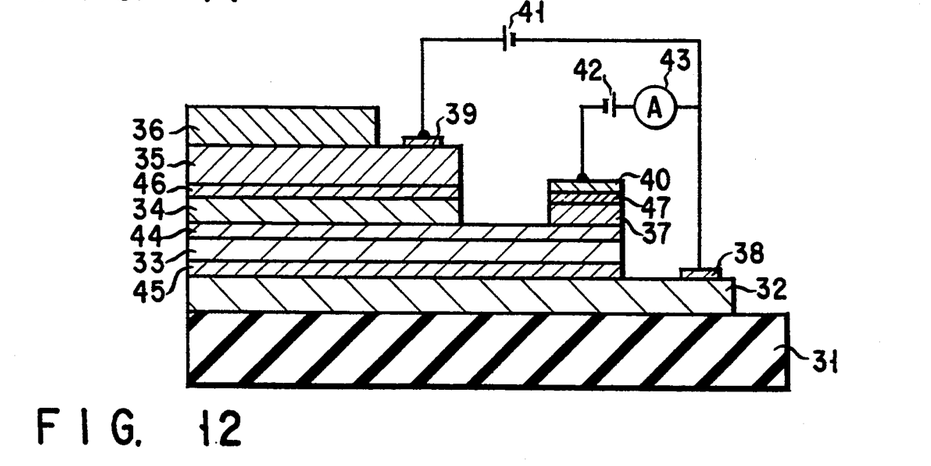
FIG. 12 is a cross sectional view showing another modification of the magnetoresistance effect element shown in FIG. 10.

FIG. 12 shows another modification of the element shown in FIG. 10. In this modification, additional semiconductor layers 45, 46 and 47 are interposed between the magnetic layer 32 and the semiconductor layer 33, between the semiconductor layer 34 and the magnetic layer 35, and between the semiconductor layer 37 and the electrode layer 40, respectively. In addition, the element shown in FIG. 12 comprises the I-type semiconductor layer 44 included in the element shown in FIG. 11. The impurity concentrations in these additional semiconductor layers 45, 46, 47 are higher than those in the semiconductor layers 33, 34, 37, respectively. These additional semiconductor layers 45, 46, 47 are intended to improve the junctions between the magnetic layer and the adjacent semiconductor layer and between the semiconductor layer and the electrode layer.

Each of the embodiments described above is intended to explain the basic operation of the magnetoresistance effect element of the present invention. In practice, the technical idea of the present invention can be embodied in various modified fashions such that the element of the present invention is prepared by repeating the basic pattern described above in a planar direction or in a direction of lamination.

Figure 15:
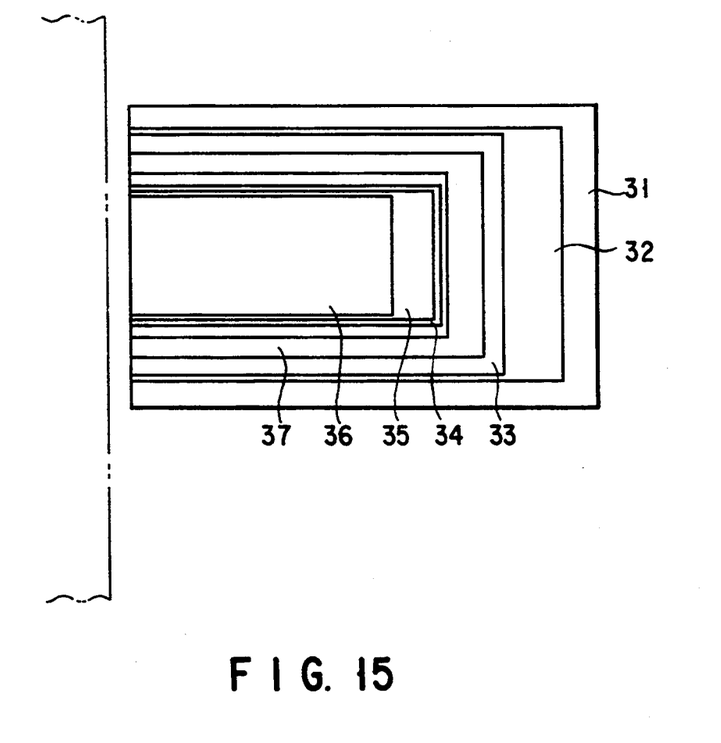
FIG. 15 is a plan view exemplifying a magnetoresistance effect element according to the third embodiment of the present invention.

For example, FIG. 15 is a plan view showing a magnetoresistance effect element prepared by slightly modifying the element shown in FIG. 10. In the modification shown in FIG. 15, the semiconductor layer 37 is formed to surround the semiconductor layer 34. The particular construction makes it possible to utilize effectively the remaining carriers which have not been recombined.

Where the magnetoresistance effect element of the present invention is used as a reading head of a magnetic recording apparatus, a recording medium 50 is positioned as shown in, for example, FIG. 15, though the positional relationship is not restricted to that shown in FIG. 15.

In each of the embodiments described above, the magnetic field is detected by directly reading the voltage or current. In addition, the magnetic field can be detected by detecting an optional physical amount reflecting the state of spin polarization such as a change in current or voltage.

The method of introducing a magnetic flux (for example, utilizing a soft magnetic material as a magnetic path) and the method of applying a magnetic bias, which are employed in the conventional MR head, can also be employed within the technical scope of the present invention.

The electrode terminal is schematically depicted in each of the accompanying drawings. Needless to say, however, a thin film-forming technique or the like can be employed for forming the wiring.

In each of the embodiments described above, an antiferromagnetic film is used for fixing the magnetization within the second magnetic layer. However, the antiferromagnetic film can be replaced by another suitable film as far as a similar function can be obtained. Further, the magnetization within the second magnetic layer need not be fixed in some cases.

Further, in each of the embodiments described above, the carriers having a spin information are injected into a semiconductor layer through magnetic layers arranged to face each other in a vertical direction. However, these magnetic layers can be arranged close to each other in the same horizontal plane.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetoresistance effect element, comprising a first magnetic layer, a second magnetic layer, and a P- or N-type semiconductor layer interposed between said first and second magnetic layers, wherein junctions are formed between said first magnetic layer and said semiconductor layer and between said semiconductor layer and said second magnetic layer.

2. The magnetoresistance effect element according to claim 1, wherein said semiconductor layer has a thickness of 50 to 10,000Å.

3. The magnetoresistance effect element according to claim 2, wherein said semiconductor layer has a thickness of 200 to 10,000Å.

4. The magnetoresistance effect element according to claim 1, wherein said semiconductor layer has impurity doping amount of $10^{16}$ to $10^{20}$ cm$^{-3}$.

5. The magnetoresistance effect element according to claim 1, wherein a Schottky barrier is formed between the first magnetic layer and the semiconductor layer and between the second magnetic layer and the semiconductor layer.

6. The magnetoresistance effect element according to claim 1, wherein an insulating layer is formed between the first magnetic layer and the semiconductor layer and between the second magnetic layer and the semiconductor layer.

7. The magnetoresistance effect element according to claim 6, wherein said insulating layer is formed of a material selected from the group consisting of an oxide and a nitride.

8. A magnetoresistance effect element, comprising a first magnetic layer, a second magnetic layer, and a semiconductor layer interposed between said first and second magnetic layers, said semiconductor layer including a first layer of a first conductivity type and a second layer of a second conductivity type, a junction being formed therebetween, and wherein junctions are formed between said first magnetic layer and said first layer and between said second magnetic layer and said second layer.

9. The magnetoresistance effect element according to claim 8, wherein said semiconductor layer has a thickness of 50 to 10,000Å.

10. The magnetoresistance effect element according to claim 9, wherein said semiconductor layer has a thickness of 200 to 10,000Å.

11. The magnetoresistance effect element according to claim 8, wherein said first and second layers of said semiconductor layer have impurity doping amount of $10^{16}$ to $10^{20}$ cm$^{-3}$.

12. The magnetoresistance effect element according to claim 8, wherein said semiconductor layer has a third layer interposed between said first and second layers thereof, said third layer being formed of an I-type semiconductor or a doped semiconductor having an impurity concentration lower than that in each of the first and second layers.

13. The magnetoresistance effect element according to claim 8, further comprising a doped semiconductor layer having an impurity concentration higher than that in said first layer of said semiconductor layer and being interposed between said first magnetic layer and said first layer, and another doped semiconductor layer having an impurity concentration higher than that in the second layer of said semiconductor layer and being interposed between said second magnetic layer and said second layer.

14. A magnetoresistance effect element, comprising a first magnetic layer, a first semiconductor layer of a first conductivity type formed on said first magnetic layer, a second semiconductor layer of a second conductivity type formed on said first semiconductor layer, a second magnetic layer formed on said second semiconductor layer, and a third semiconductor layer of said second conductivity type formed on said first semiconductor layer, wherein junctions are formed between said first magnetic layer and said first semiconductor layer, between said first semiconductor layer and said second semiconductor layer, between said second semiconductor layer and said second magnetic layer, and between said first semiconductor layer and said third semiconductor layer.

15. The magnetoresistance effect element according to claim 14, wherein the total thickness of said first and second semiconductor layers is 50 to 10,000Å.

16. The magnetoresistance effect element according to claim 15, wherein the total thickness of said first and second semiconductor layers is 200 to 10,000Å.

17. The magnetoresistance effect element according to claim 14, wherein said semiconductor layers have impurity doping amount of $10^{16}$ to $10^{20}$ cm$^{-3}$.

18. The magnetoresistance effect element according to claim 14, further comprising a fourth semiconductor layer interposed between said first and second semiconductor layers, said fourth semiconductor layer being formed of an I-type semiconductor or a doped semiconductor having an impurity concentration lower than that in each of the first and second semiconductor layers.

19. The magnetoresistance effect element according to claim 14, further comprising a doped semiconductor layer having an impurity concentration higher than that in the first semiconductor layer and being interposed between said first magnetic layer and said first semiconductor layer, and another doped semiconductor layer having an impurity concentration higher than that in the second semiconductor layer and being interposed between said second magnetic layer and said second semiconductor layer.

* * * * *